United States Patent

Lee et al.

[11] Patent Number: 6,033,981
[45] Date of Patent: Mar. 7, 2000

[54] KEYHOLE-FREE PROCESS FOR HIGH ASPECT RATIO GAP FILING

[75] Inventors: Yu-Hua Lee, Hsinchu; Cheng-Ming Wu, Kao-Hsiung, both of Taiwan

[73] Assignee: Taiwan Semiconductor Manufacturing Company, Hsin-Chu, Taiwan

[21] Appl. No.: 09/358,988

[22] Filed: Jul. 22, 1999

[51] Int. Cl.[7] .............................................. H01L 21/4763
[52] U.S. Cl. ...................... 438/624; 438/631; 438/633; 438/637; 438/634
[58] Field of Search .................... 438/622, 623, 438/624, 631, 633, 634, 636, 637; 257/758, 759, 760

[56] References Cited

U.S. PATENT DOCUMENTS

| | | | |
|---|---|---|---|
| 5,310,700 | 5/1994 | Lien et al. | 438/622 |
| 5,393,709 | 2/1995 | Lur et al. | 438/622 |
| 5,494,854 | 2/1996 | Jain | 438/633 |
| 5,545,919 | 8/1996 | Ueda et al. | 257/641 |
| 5,641,712 | 6/1997 | Grivna et al. | 438/624 |
| 5,665,657 | 9/1997 | Lee | 438/624 |
| 5,679,606 | 10/1997 | Wang et al. | 437/195 |
| 5,721,173 | 2/1998 | Yano et al. | 438/424 |
| 5,728,621 | 3/1998 | Zheng et al. | 438/427 |
| 5,817,567 | 10/1998 | Jang et al. | 438/427 |
| 5,858,870 | 1/1999 | Zheng et al. | 438/622 |

OTHER PUBLICATIONS

Broomfield, M., "HDP Dielectric BEOL Gapfill: A Process for Manufacturing," Advanced Semiconductor Manufacturing Conference and Workshop, 1996, ASMC 96 Proceedings, IEEE/SEMI 1996, pp. 255–258.

Kim, J., et al., "Characterization of the HDP–CVD Oxide as Interlayer Dielectric Material for Subs–quarter Micron CMOS," Interconnect Technology Conference, Proceedings of the IEEE 1998 International, pp. 274–276.

*Primary Examiner*—T. N. Quach
*Attorney, Agent, or Firm*—George O. Saile; Stephen B. Ackerman; Rosemary L.S. Pike

[57] ABSTRACT

A method to eliminate voids in the dielectric oxide between closely spaced conducting lines is achieved. A substrate is provided. Narrowly spaced conductive lines are provided on the substrate. A high density plasma (HDP) dielectric layer is deposited overlying the conductive lines and the substrate. The HDP layer is etched through to expose the edges of the conducting lines. An insulating layer is deposited overlying the HDP layer and conducting lines. A chemical mechanical polishing (CMP) is used to remove the peaks of the insulating layer, exposing the HDP layer in the area overlying the conducting lines. The exposed HDP layer is etched away exposing the top surface of the conducting lines. The insulating layer is then selectively etched away. Spacers may then be added along the sidewalls of the conductor. Finally, a second HDP layer is deposited overlying the first dielectric layer and conducting lines free from voids. The integrated circuit device is completed.

25 Claims, 5 Drawing Sheets

KEYHOLE-FREE PROCESS FOR HIGH ASPECT RATIO GAP FILING

BACKGROUND OF THE INVENTION

(1) Field of the Invention

The present invention relates to the fabrication of semiconductor devices, and more particularly, to a method to eliminate shorts between adjacent conducting lines due to interlevel dielectric voids, known as keyholes, in the manufacture of integrated circuits.

(2) Description of the Prior Art

Feature size reduction is essential for realizing increased device content and higher switching speeds on integrated circuits. Inter-electrode spacings of 0.2 microns are now in fabrication. As these spacings are reduced, and the conductor height to spacing ratio approaches 4:1, it is difficult to deposit dielectric material over these electrodes without creating gaps or voids in the dielectric material.

In FIG. 1, a cross-section of two conducting lines 44 patterned on substrate 40 in an integrated circuit is shown. A layer of dielectric 46 comprised of silicon oxide overlays the conducting lines and the surface of the substrate 40.

A problem typical to the art is shown in FIG. 1. The conducting lines 44 have a spacing S1 of about 0.2 microns or less. The aspect ratio of height to width of the gap between the conducting lines is currently about 2:1, but is becoming higher. At this close spacing, air gaps, voids, or keyholes 42 will form in the dielectric oxide layer 46 in the area between the conducting lines 44. These air gaps can be either helpful or harmful to the integrated circuit depending on subsequent processing. Air gaps in the dielectric can be helpful because the dielectric constant of air is much less than that of silicon oxide. The capacitive coupling between the two transistors can be reduced by the air gap. This improves circuit performance. These voids can cause real problems, however, in situations where the compromised integrity of the dielectric can allow a shorting condition to occur. For example, when contacts are made through openings in the dielectric, the presence of a keyhole could cause two contacts to be connected through the keyhole causing a short. In a dynamic random access memory (DRAM) integrated circuit, for example, two cells could be connected through a keyhole, causing a twin-bit failure.

FIG. 2 demonstrates the same problem where silicon nitride spacers 48 are deposited along the conducting line 44 sidewall. Here, because of the presence of the spacers 48, the aspect ratio is higher than 2:1. Subsequent deposition of the dielectric oxide layer 46 will again result in the formation of a keyhole 42.

Several prior art approaches attempt to address the problems of voids in the dielectric layer. U.S. Pat. No. 5,665,657 to Lee teaches a method to remove voids in spin on glass layers by using an etch and fill method. U.S. Pat. No. 5,858,870 to Zheng et al teaches a method to fill gaps and planarize the dielectric layer using an anti-reflective coating with a chemical-mechanical polishing (CMP) etch stop. U.S. Pat. No. 5,817,567 to Jang et al teaches a method of shallow trench isolation (STI) where a layer of hard dielectric material is placed over a conformal silicon oxide. This is then planarized using CMP. U.S. Pat. No. 5,728,621 to Zheng et al teaches a method of STI planarization using a combination of high-density plasma (HDP) oxide and spin-on-glass (SOG) layers. U.S. Pat. No. 5,721,173 to Yano et al teaches a method of STI using selective etching of dielectric films. U.S. Pat. No. 5,679,606 to Wang et al teaches a method where interlevel dielectric structures are formed using an in-situ multi-step electron cyclotron resonance (ECR) oxide deposition process.

SUMMARY OF THE INVENTION

A principal object of the present invention is to provide an effective and very manufacturable method of depositing dielectric oxides over closely spaced conducting lines free of voids (or keyholes) in the manufacture of integrated circuits.

A further object of the present invention is to provide keyhole free gap filling using a two step high-density plasma (HDP) oxide.

A yet further object of the present invention is to provide a method to fill gaps without forming voids.

In accordance with the object of this invention, a new method for depositing dielectric oxide in an integrated circuit is achieved. This method prevents conductive shorts caused by air voids in the dielectric layer between narrowly spaced adjacent conductive lines. A semiconductor substrate is provided having narrowly spaced first conductive lines. The conductive lines may be MOS transistor gates, metal traces, or polysilicon traces. An HDP oxide layer is formed overlying the first conductive lines and the substrate. This oxide layer is etched back slightly exposing a portion of the sidewalls of the conductive lines. The entire surface is then covered using a nitride deposition. The peaks of the nitride, which correspond to the location of the conductive lines, are removed exposing the oxide layer. The exposed oxide and nitride are etched away over the conducting lines leaving a portion of the inter-electrode spacing filled with oxide. Silicon nitride spacers are then deposited along the electrode sidewalls. A second deposition of oxide is then performed with no voids formed since the depth of the interelectrode spacing is now reduced.

BRIEF DESCRIPTION OF THE DRAWINGS

In the accompanying drawings forming a material part of this description, there is shown.

DESCRIPTION OF THE PREFERRED EMBODIMENTS

In the preferred embodiment, the present invention will be shown applied to the deposition of a dielectric between two closely spaced conducting lines. For example, the present invention might be applied to closely spaced polysilicon traces overlying thick field oxide. Alternately, polysilicon gate electrodes overlying gate oxide, metal traces overlying thick field oxide, or metal traces overlying source and drain structures could be substituted in the preferred embodiments. Such metal traces could be comprised preferably of aluminum, copper, or an alloy of aluminum and copper. Any application where metal or polysilicon traces or polysilicon gates are closely spaced can cause air voids to occur in the dielectric layer. The present invention will solve the potential contact shorting problem in any of these applications.

Figure 1:
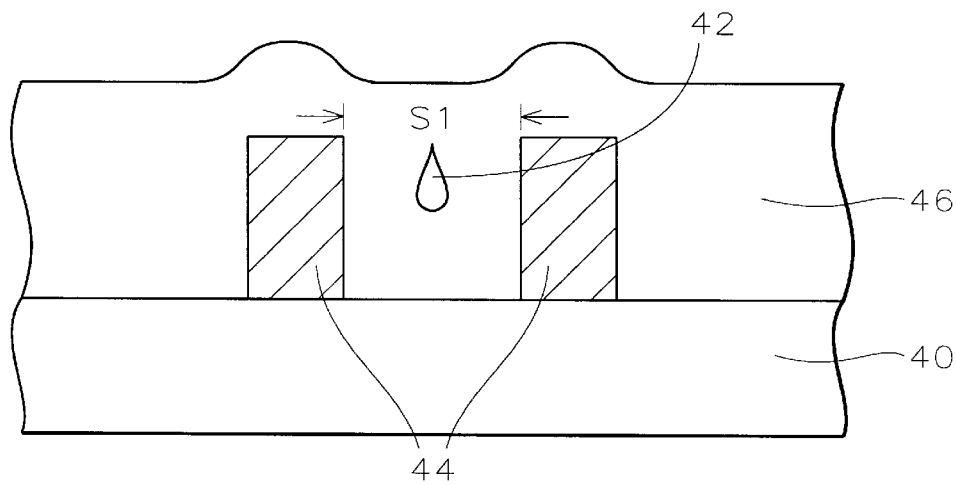
FIGS. 1 and 2 schematically illustrate in cross-section partially completed prior art integrated circuits showing the problem of air voids inducing conductive shorts.
Figure 2:
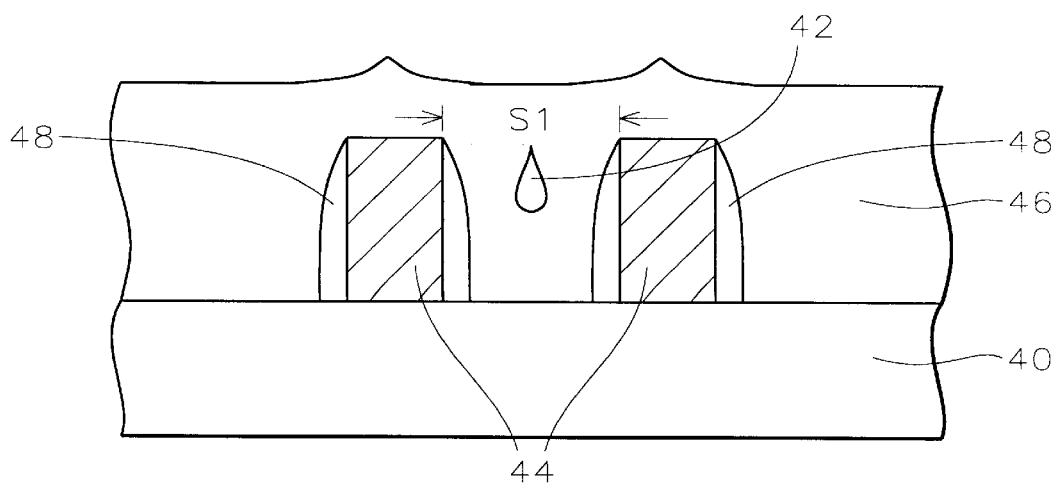
Figure 3:
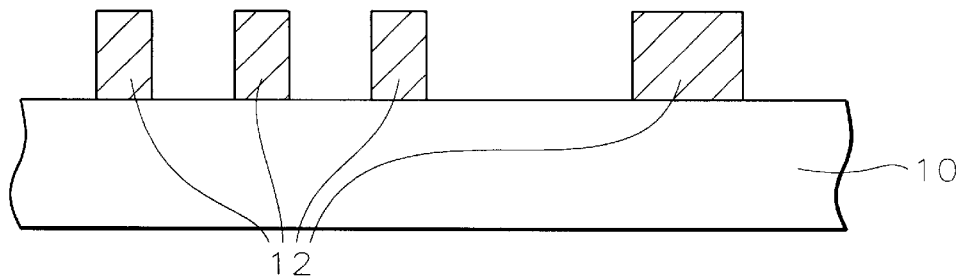
FIGS. 3 through 10 schematically illustrate in cross-sectional representation a preferred embodiment of the present invention.

Referring now more particularly to FIG. 3, there is illustrated a portion of a partially completed integrated circuit. A substrate 10 is provided. Conductive lines 12, are patterned as is conventional in the art. Conductive lines 12 have a typical spacing of between approximately 0.10 to 0.35 microns, and a typical thickness of between approximately 2000 to 6000 angstroms. This results in a thickness to spacing ratio of the conductive lines more than 2:1.

Figure 4:
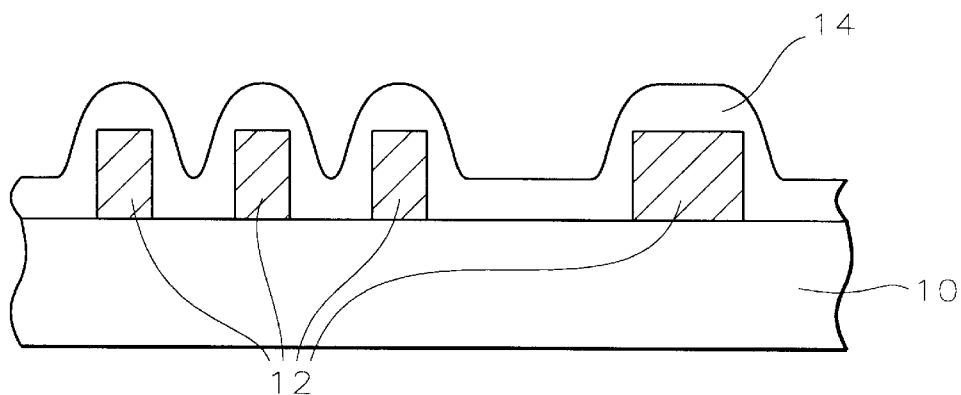

Referring now to FIG. 4, a high-density plasma (HDP) oxide layer 14 is then applied using a $SiH_4$ and $O_2$ source, forming mounds over the conductive lines. The oxide layer 14 has a thickness of between approximately 1000 to 3000 angstroms, and is approximately 50% of the conductive line 12 height.

Figure 5:
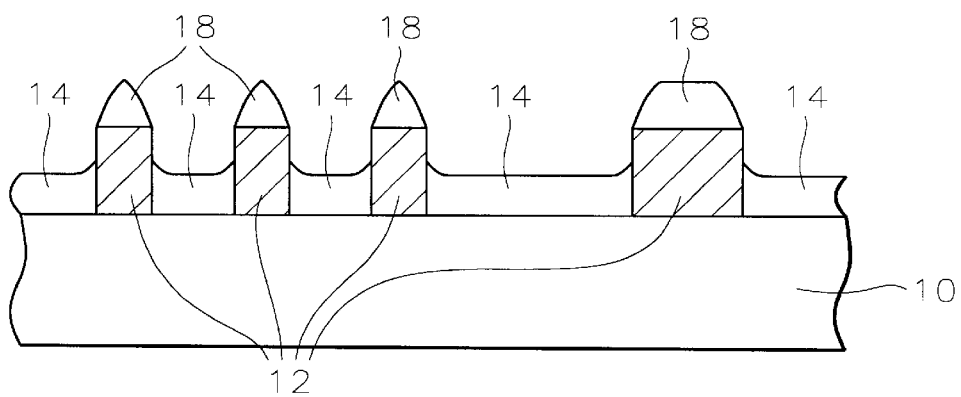

Referring now to FIG. 5, the oxide layer 14 is isotropically etched as is conventional in the art so that a portion of the sidewalls is exposed. Typically, this will be a wet etch dip such as a buffered oxide etch (BOE). However, if the conductors are metal, a dry isotropic etch such as $CF_4$ or $CHF_3$ will be used. Portions 18 of the first HDP oxide remain over the top surfaces of the conductors, as shown. This etch will remove any keyholes that might have formed between the conductors.

Figure 6:
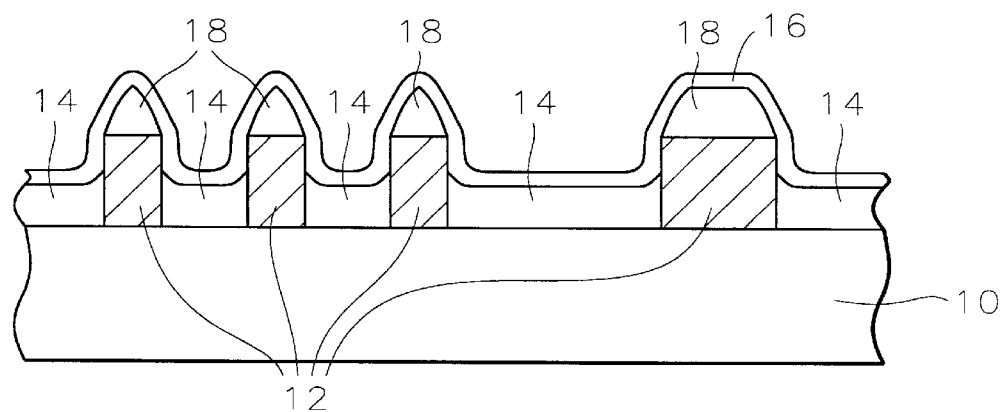

Referring now to FIG. 6, a silicon nitride layer 16, is deposited over the entire surface to a thickness of between about 100 and 500 Angstroms.

Figure 7:
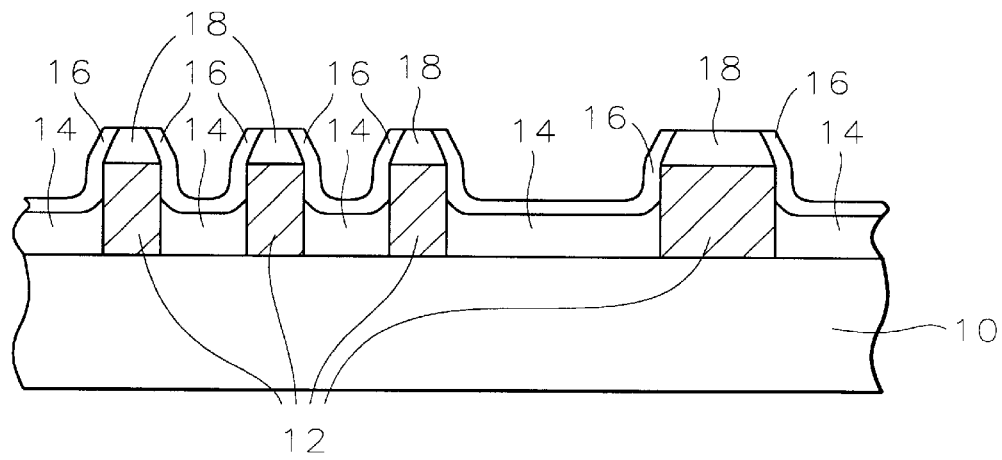

Referring now to FIG. 7, chemical mechanical polishing is performed removing the peaks of the nitride layer 16 and exposing oxide layer 18 over the conductive lines 12. The oxide layer 14 between the conductors is protected by the silicon nitride layer 16.

For non-metallic conductive lines 12, a wet etch is used to completely remove the exposed oxide layer 18 overlying the conductive lines 12. Wet etch chemistry may include a BOE or a dilute HF. For metal conductive lines 12, an isotropic etch such as CO, $CF_4$ or $CHF_3$ with a high selectivity between SiN and metal will be used. This is followed by a nitride wet dip of, for example, $H_3PO_4$, completely removing the silicon nitride layer 16. The result is shown in FIG. 8.

Figure 9:
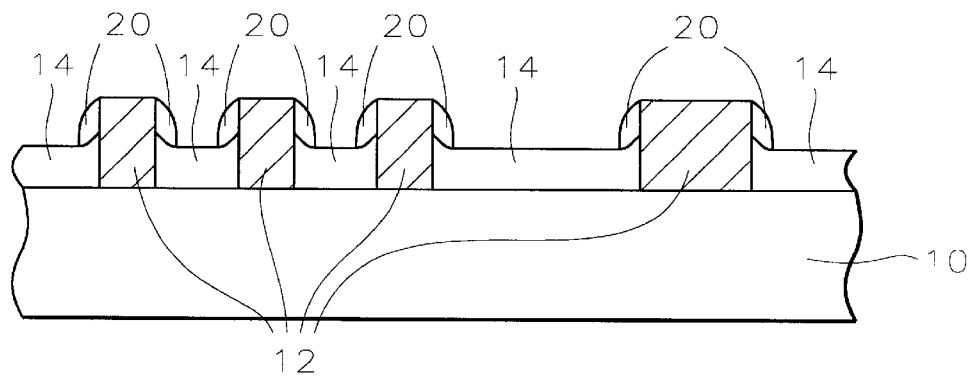

Referring now to FIG. 9, in a preferred alternative, a layer of silicon nitride is deposited and anisotropically etched back to leave silicon nitride spacers 20 on the sidewalls of the conductors. These spacers 20 will be used to form a self-aligned contact between narrowly spaced conducting lines.

Figure 10:
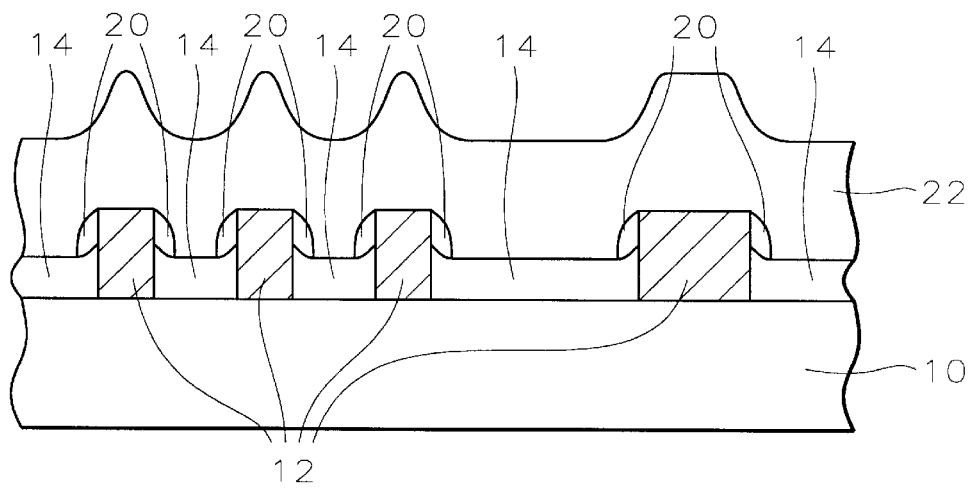

Referring now to FIG. 10, a second HDP oxide layer 22, is deposited to a thickness of between about 1000 and 3000 angstroms. Since the first HDP oxide layer 14 has reduced the aspect ratio of the gap, this second HDP oxide layer 22 completely fills the gap between the conducting lines without voids.

Figure 8:
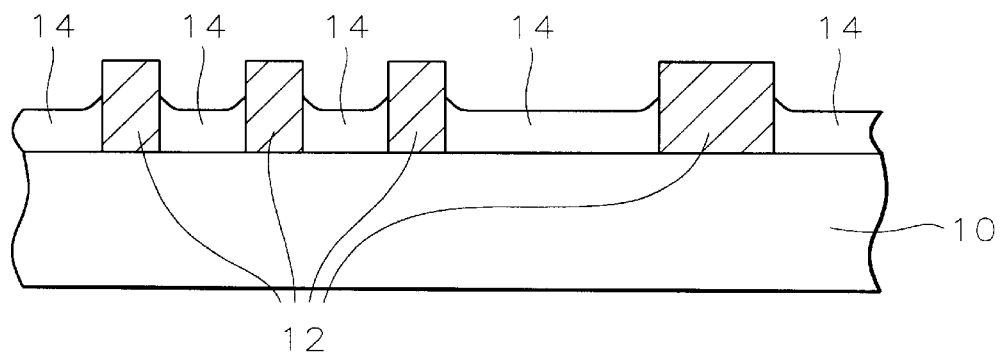
Figure 11:
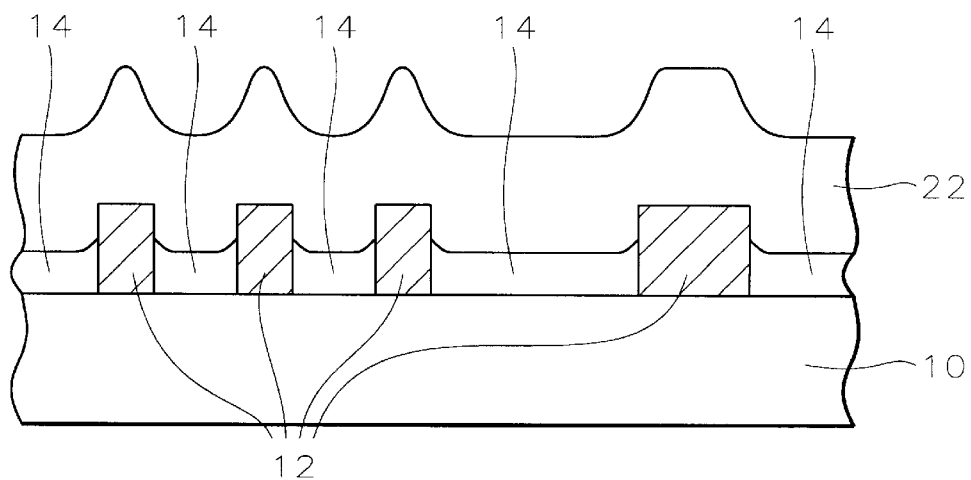
FIG. 11 schematically illustrates in cross-sectional representation an alternative embodiment of the present invention.

FIG. 11 illustrates a continuation of the process from FIG. 8, where nitride spacers are not included. A second HDP oxide layer 22 is deposited without voids. This process flow may be desirable for wider line spacing where self-aligned contacts are not needed.

Figure 12:
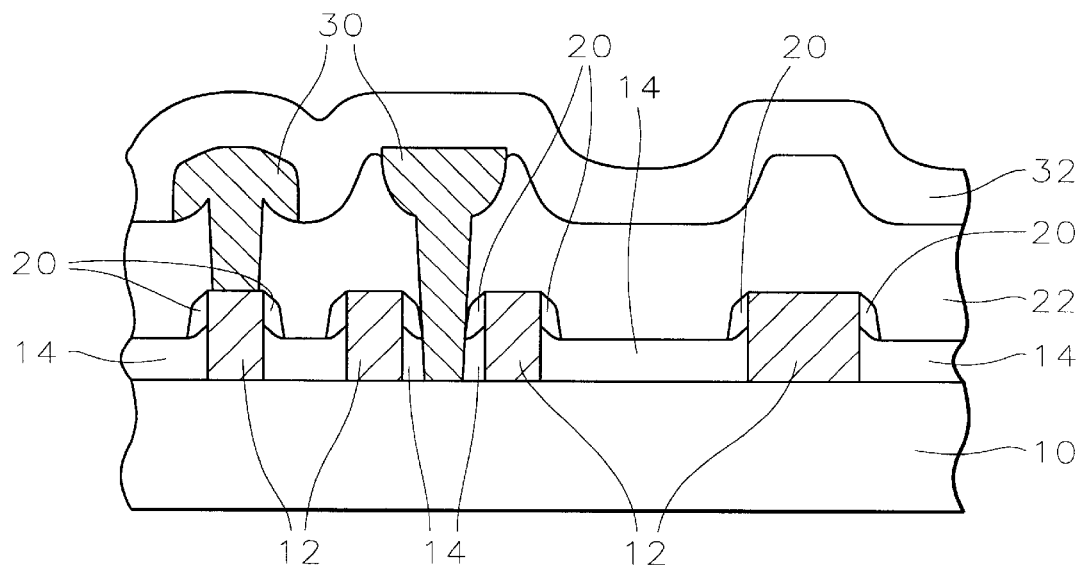
FIG. 12 illustrates in cross-sectional representation a completed integrated circuit device fabricated according to the preferred embodiment of the present invention.

Referring now to FIG. 12, a self-aligned contact opening is made through the HDP oxide layers 22 and 14 to one of the underlying semiconductor device structures, not shown. The silicon nitride spacers 20 narrow the contact opening between the conducting lines 12. A second conducting line 30 (on right) is shown within the contact opening. Also shown is a conducting line 30 (on left) contacting one of the lower conducting lines 12 A passivation layer 32 completes the integrated circuit device.

Figure 13:
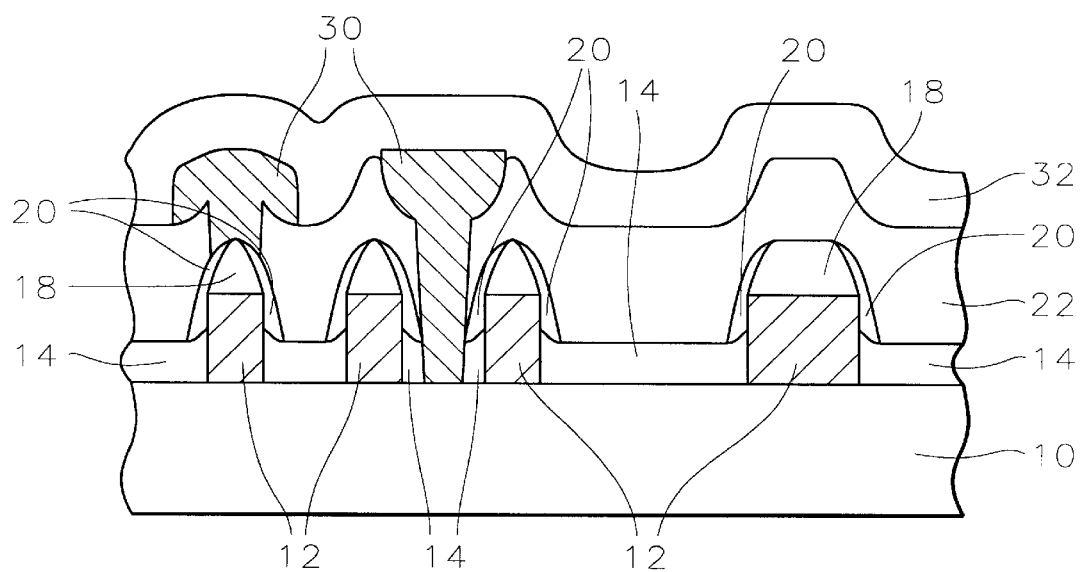
FIG. 13 schematically illustrates in cross-sectional representation an undesirable embodiment of the invention.

FIG. 13 illustrates the significance of all of the steps in the inventive process. Eliminating the nitride deposition (FIG. 6) step, the CMP polishing (FIG. 7), and the oxide and nitride dips (FIG. 8) will result in an extra portion of spacers 20 above the conducting lines 12. If the oxide 18 above the conducting lines 12 is completely covered by the nitride spacer 20, contact from a second conductor 30 cannot be made to the conducting line 12. The result is referred to as a "blind contact," as shown below the conducting line 30 on the left.

As has been shown in the preferred embodiment, this novel approach to gap filling eliminates shorting of conductive material through voids in the dielectric layer between narrowly spaced adjacent conducting lines, MOS gates, or gaps. Further, the process of the present invention provides a very manufacturable process.

While the invention has been particularly shown and described with reference to the preferred embodiments thereof, it will be understood by those skilled in the art that various changes in form and details may be made without departing from the spirit and scope of the invention.

What is claimed is:

1. A method to eliminate the formation of voids in a gap between closely spaced conducting lines in an integrated circuit device comprising:

providing a substrate;

providing said closely spaced conducting lines having said gap therebetween on said substrate;

depositing a first HDP oxide layer overlying tops and sidewalls of said conducting lines and said substrate;

isotropically etching said first HDP oxide layer exposing an upper portion of said sidewalls of said conducting lines;

depositing an insulating layer overlying said first HDP oxide layer and said exposed conducting line sidewalls;

removing said insulating layer overlying said HDP oxide layer on said tops of said conducting lines using chemical mechanical polishing;

etching away exposed areas of said first HDP oxide layer overlying said tops of said conducting lines;

thereafter removing said insulating layer;

forming insulating spacers on said upper portion of said sidewalls of said conducting lines;

depositing a second HDP oxide layer overlying said first HDP oxide layer, said conducting lines and said insulating spacers thereby filling said gap between said conducting lines; and completing said integrated circuit device.

2. The method according to claim 1 wherein said narrowly spaced conducting lines comprise one of the group containing: polysilicon, aluminum, copper, alloys of aluminum, and alloys of copper.

3. The method according to claim 1 wherein said closely spaced conducting lines are spaced less than about 0.01 microns apart and have a thickness of at most 6000 angstroms.

4. The method according to claim 1 wherein said first HDP oxide layer deposited using $SiH_4$ and $O_2$ as a silicon source and deposited to a thickness of between about 1000 and 3000 angstroms.

5. The method according to claim 1 wherein said insulating layer comprises silicon nitride deposited to a thickness of between about 100 and 500 angstroms.

6. The method according to claim 1 wherein said etching away of said first HDP oxide layer is by a wet etching process using a buffered oxide etch (BOE).

7. The method according to claim 1 wherein said etching away of said first HDP oxide layer is by a dry etching process using a chemistry of $CF_4$ or $CHF_3$ gases.

8. The method according to claim 1 wherein said step of removing said insulating layer is by a wet etching process using a buffered oxide etch (BOE).

9. The method according to claim 1 wherein said second HDP oxide layer is deposited using $SiH_4$ and $O_2$ as a silicon source to a thickness of between about 1000 and 3000 angstroms.

10. The method according to claim 1 wherein said insulating spacers comprise silicon nitride.

11. A method to form contacts in an integrated circuit device comprising:

provided semiconductor device structures formed in and on a semiconductor substrate;

depositing an insulating layer overlying said semiconductor device structures;

forming conducting lines overlying said insulating layer and contacting some of said semiconductor device structures through openings in said insulating layer wherein a gap remains between said conducting lines;

depositing a first HDP oxide layer overlying tops and sidewalls of said conducting lines and said substrate;

isotropically etching said first HDP oxide layer exposing an upper portion of said sidewalls of said conducting lines;

depositing an insulating layer overlying said first HDP oxide layer and said exposed conducting line sidewalls;

removing said insulating layer overlying said HDP oxide layer on said tops of said conducting lines using chemical mechanical polishing;

etching away exposed areas of said first HDP oxide layer overlying said tops of said conducting lines;

thereafter removing said insulating layer;

forming insulating spacers on said upper portion of said sidewalls of said conducting lines;

depositing a second HDP oxide layer overlying said first HDP oxide layer, said conducting lines and said insulating spacers thereby filling said gap between said conducting lines;

forming a self-aligned contact opening between two of said conducting lines whereby said insulating spacers act as an etch stop in forming said self-aligned contact; and filling said self-aligned contact opening with a second conducting line to complete said formation of said contacts in the fabrication of said integrated circuit device.

12. The method according to claim 11 wherein said conducting lines comprise one of the group containing: polysilicon, aluminum, copper, alloys of aluminum, and alloys of copper.

13. The method according to claim 11 wherein said conducting lines have an aspect ratio of more than about 2:1.

14. The method according to claim 11 wherein said first HDP oxide layer deposited using $SiH_4$ and $O_2$ as a silicon source and deposited to a thickness of between about 1000 and 3000 angstroms.

15. The method according to claim 11 wherein said insulating layer comprises silicon nitride deposited to a thickness of between about 100 and 500 angstroms.

16. The method according to claim 11 wherein said etching away of said first HDP oxide layer is by a wet etching process using a buffered oxide etch (BOE).

17. The method according to claim 11 wherein said etching away of said first HDP oxide layer is by a dry etching process using a chemistry of $CF_4$ or $CHF_3$ gases.

18. The method according to claim 11 wherein said etching through of said insulating layer is by a wet etching process using a buffered oxide etch (BOE).

19. The method according to claim 11 wherein said second HDP oxide layer is deposited using $SiH_4$ and $O_2$ as a silicon source to a thickness of between about 1000 and 3000 angstroms.

20. The method according to claim 11 wherein said insulating spacers comprise silicon nitride.

21. The method according to claim 11 wherein said semiconductor device structures include gate electrodes and associated source and drain regions of MOS devices.

22. A method to form contacts in an integrated circuit device comprising:

providing semiconductor device structures formed in and on a semiconductor substrate wherein said semiconductor device structures include gate electrodes and associated source and drain regions of MOS devices;

depositing an insulating layer overlying said semiconductor device structures;

forming conducting lines overlying said insulating layer and contacting some of said semiconductor device structures through openings in said insulating layer wherein a gap formed between two of said conducting lines has an aspect ratio of at least 2:1;

depositing a first HDP oxide layer overlying tops and sidewalls of said conducting lines and said substrate;

isotropically etching said first HDP oxide layer exposing an upper portion of said sidewalls of said conducting lines;

depositing a silicon nitride layer overlying said first H)P oxide layer and said exposed conducting line sidewalls;

removing said insulating layer overlying said HDP oxide layer on said tops of said conducting lines using chemical mechanical polishing;

etching away exposed areas of said first HDP oxide layer overlying said tops of said conducting lines;

thereafter removing said silicon nitride layer;

forming insulating spacers on said upper portion of said sidewalls of said conducting lines;

depositing a second HDP oxide layer overlying said first HDP oxide layer, said conducting lines said insulating spacers and covering said conducting lines wherein said gap has an aspect ratio of less than 2:1 because of the presence of said first HDP oxide layer within said gap and whereby no voids are formed within said second HDP oxide layer within said gap;

forming a self-aligned contact opening between two of said conducting lines whereby said silicon nitride spacers act as an etch stop in forming said self-aligned contact; and filling said self-aligned contact opening with a second conducting line to complete said formation of said contacts in the fabrication of said integrated circuit device.

23. The method according to claim 22 wherein said conducting lines comprise one of the group containing: polysilicon, aluminum, copper, alloys of aluminum, and alloys of copper.

24. The method according to claim 22 wherein said first HDP oxide layer is deposited to a thickness of between about 1000 and 3000 angstroms.

25. The method according to claim 22 wherein said second HDP oxide layer is deposited to a thickness of between about 1000 and 3000 angstroms.

* * * * *